United States Patent [19]

Frommeld et al.

[11] Patent Number: 5,057,398

[45] Date of Patent: Oct. 15, 1991

[54] PHOTOPOLYMERIZABLE COMPOSITION AND PHOTOPOLYMERIZABLE RECORDING MATERIAL CONTAINING SAME

[75] Inventors: Hans-Dieter Frommeld, Wiesbaden; Hansjoerg Vollmann, Bad-Soden-Neuenhain, both of Fed. Rep. of Germany

[73] Assignee: Hoechst Aktiengesellschaft, Frankfurt/Main, Fed. Rep. of Germany

[21] Appl. No.: 515,669

[22] Filed: Apr. 26, 1990

Related U.S. Application Data

[63] Continuation of Ser. No. 38,196, Apr. 14, 1987, abandoned.

[30] Foreign Application Priority Data

Apr. 23, 1986 [DE] Fed. Rep. of Germany ....... 3613632

[51] Int. Cl.$^5$ .............................................. G03F 7/031
[52] U.S. Cl. ..................................... 430/277; 430/281; 430/916; 430/920; 430/925; 430/926; 430/278; 430/271; 430/288; 522/9; 522/14; 522/16; 522/26
[58] Field of Search ............... 430/916, 920, 925, 926, 430/281, 277, 278, 271, 288; 522/9, 14, 16, 26

[56] References Cited

U.S. PATENT DOCUMENTS

| | | | |
|---|---|---|---|
| 3,615,451 | 10/1971 | Ernst | 522/26 X |
| 3,765,898 | 10/1973 | Bauer et al. | 96/115 P |
| 4,101,323 | 7/1978 | Buhr et al. | 96/35 |
| 4,189,323 | 2/1980 | Buhr | 430/281 |
| 4,212,970 | 7/1980 | Iwasaki | 542/455 |
| 4,232,106 | 11/1980 | Iwasaki et al. | 430/170 |
| 4,239,850 | 12/1980 | Kita et al. | 430/281 |
| 4,258,123 | 3/1981 | Nagashina et al. | 430/281 |
| 4,279,982 | 7/1981 | Iwasaki et al. | 430/170 |
| 4,371,606 | 2/1983 | Doenges | 430/281 |
| 4,371,607 | 2/1983 | Doenges | 430/281 |
| 4,505,793 | 3/1985 | Tamoto et al. | 430/281 X |
| 4,535,052 | 8/1985 | Anderson et al. | 430/925 X |
| 4,548,892 | 10/1985 | Iwasaki et al. | 430/288 |
| 4,555,474 | 11/1985 | Kawamura et al. | 522/9 X |
| 4,661,434 | 4/1987 | Iwasaki et al. | 522/26 X |
| 4,774,163 | 9/1988 | Higashi | 430/281 |

FOREIGN PATENT DOCUMENTS

| | | |
|---|---|---|
| 0135348 | 3/1985 | European Pat. Off. . |
| 0135863 | 4/1985 | European Pat. Off. . |
| 54-151024 | 11/1979 | Japan . |
| 58-40302 | 3/1983 | Japan . |
| 1354541 | 5/1974 | United Kingdom . |
| 1388492 | 3/1975 | United Kingdom . |
| 1555215 | 11/1979 | United Kingdom . |

*Primary Examiner*—Cynthia Hamilton
*Attorney, Agent, or Firm*—Foley & Lardner

[57] ABSTRACT

A photopolymerizable composition that contains a polymeric binder, a polymerizable compound and photoinitiator combination comprising an N-heterocyclic compound and a halogen compound corresponding to one of the folowing formulas I and II

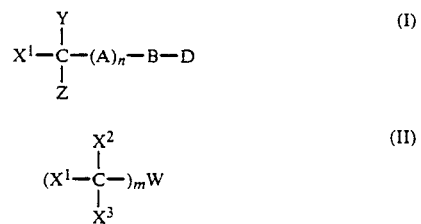

in which
X$^1$ stands for chlorine or bromine,
X$^2$ and X$^3$ are identical or different and denote X$^1$, hydrogen or alkyl groups,
Y and Z are identical or different and denote X$^1$, hydrogen, CN or (A)$_n$—(B)$_n$—D,
A is a phenylene group,
n is 0 or 1,
B is CO or SO$_2$,
D is R, OR, NHR, NH$_2$, NR$_2$ or CX$^1$X$^2$X$^3$,
R is an alkyl, cycloalkyl, aryl or heteroyl radical,
W is a five or six-membered heterocyclic ring having from 1 to 3 heteroatoms, which optionally carries substituents and optionally a fused aromatic ring, and
m is 1 or 2,
is distinguished by an improved light sensitivity.

19 Claims, No Drawings

PHOTOPOLYMERIZABLE COMPOSITION AND PHOTOPOLYMERIZABLE RECORDING MATERIAL CONTAINING SAME

This application is a continuation of application Ser. No. 07/038,196, filed Apr. 14, 1987 now abandoned.

BACKGROUND OF THE INVENTION

The present invention relates to a photopolymerizable composition that contains a polymeric binder; an ethylenically unsaturated, polymerizable compound; and a photoinitiator.

Compositions of this kind are used for producing printing plates, relief images and photoresists and are known, for example, from German patents No. 1,171,267, No. 2,027,467 and No. 2,039,861, and from German Offenlegungsschriften No. 15 22 575, No. 20 64 079 and No. 20 64 080 (corresponding to U.S. Pat. No. No. 3,804,631). They are employed, in particular, as recording materials for the photomechanical production of lithographic printing plates and for photoresist processes.

In the photopolymerizable layers of these compositions or reproduction materials, respectively, dyes or pigments are usually included to improve the visibility of the relief image following development. The colored additives should be lightfast by nature, since the stencil obtained after development, which consists of the light-hardened layer constituents, must exhibit a maximum of contrast.

As a further component, these compositions contain photoinitiators which absorb the light of metal halide lamps ($\lambda > 350$ nm) used in commercial copying apparatus.

It is known that organic halogen compounds absorb light and split off radicals capable of initiating a photopolymerization reaction. As a group, however, these organic halogen compounds absorb light only in the short-wave UV region ($\lambda < 350$ nm).

Attempts have been made to shift the absorption of compounds of this kind into the longer-wavelength region by incorporating chromophoric radicals in heterocycles containing trichloromethyl groups. Absorption bands between 350 and 450 nm are described for triazine derivatives in German Offenlegungsschriften No. 22 43 621 and No. 27 18 259; for oxadiazole derivatives in German Offenlegungsschriften No. 28 51 472 and No. 29 49 396, for oxazoles in German Offenlegungsschriften No. 30 21 590 and No. 30 21 599; and for thiazoles in European Patent Applications No. 0 135 348 and No. 0 135 863.

Moreover, it has been indicated in the literature that halogen compounds can be sensitized for photoreaction by adding sensitizers, some of which are moderately active. German Offenlegungsschriften No. 28 51 641 and No. 29 34 758 describe a combination of trihalogenomethyltriazines with 2-benzoylmethylenenaphtho[1,2-d]thiazole, while German Offenlegungsschrift No. 26 10 842 describes a mixture composed of N-phenylacridone and trihalogenomethyl compounds. It is also possible to sensitize α-halogenocarboxamides (German Offenlegungsschrift No. 27 18 200) or tribromomethyl-phenylsulfones (German Offenlegungsschrift No. 35 03 113) by means of photoinitiators, such as benzophenone, benzil and Michler's ketone.

The goal of these attempts to shift the absorption of organic halogen compounds has been to increase the light sensitivity of photopolymerizable compositions, by an improved light absorption of the photoinitiator system. At present, fulfillment of this goal is still sought after.

SUMMARY OF THE INVENTION

It is therefore an object of the present invention to provide photopolymerizable compositions that have a higher light sensitivity and are, at the same time, stable in storage.

It is another object of the present invention to provide a photopolymerizable recording material that is particularly sensitive to irradiation by light sources typically used for commercial copying.

In accomplishing the foregoing objects, there has been provided, in accordance with one aspect of the present invention, a photopolymerizable composition comprising (a) a polymeric binder, (b) a compound having at least one terminal ethylenic double bond, (c) an N-heterocyclic photoinitiator compound and (d) a halogen compound represented by one of the following formulas:

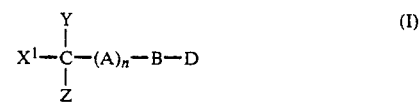

in which $X^1$ is for chlorine or bromine, $X^2$ and $X^3$ are identical or different, and each is $X^1$, hydrogen or an alkyl group, Y and Z are identical or different, and each is $X^1$, hydrogen, CN or $(A)_n-(B)_n-D$, A is a phenylene group, n is 0 or 1, B is CO or $SO_2$, D is R, OR, NHR, $NH_2$, $NR_2$ or $CX^1X^2X^3$, R is an alkyl, a cycloalkyl, an aryl or a heteroyl radical, W is a five- or six-membered heterocyclic ring having from 1 to 3 heteroatoms, and m is 1 or 2.

In accordance with another aspect of the present invention, a photopolymerizable recording material has been provided that comprises a support and a photopolymerizable layer comprised of the above-described composition. In a preferred embodiment, the support comprises a transparent plastic film.

Other objects, features and advantages of the present invention will become apparent from the following detailed description. It should be understood, however, that the detailed description and the specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

In general formulas I and II, $X^1$, $X^2$ and $X^3$ preferably are Cl. In particular, for compounds corresponding to formula II, $X^1$, $X^2$ and $X^3$ preferably are chlorine atoms. In the compounds corresponding to formula I, at least one, preferably at least two, of the radicals $X^1$, Y and Z is a halogen atom, respectively. Of the radicals Y and Z, at most one, and preferably neither, is a hydrogen atom. It is preferable that one, at most, of these radicals is a CN group or a group $(A)_n—(B)_n—D$. If B is an $SO_2$ group, the molecule preferably does not contain another $SO_2$ group.

If A is a phenylene group, this group can be unsubstituted or substituted by halogen atoms and by alkyl or alkoxy groups having 1 or 2 carbon atoms.

D preferably is R, NHR, $NH_2$ or, if the molecule contains two radicals D, $CX^1X^2X^3$.

R can be an alkyl radical having from 1 to 6 carbon atoms, preferably from 1 to 3 carbon atoms. If R is a cycloalkyl group, this group preferably has 5 or 6 ring members. It can be substituted, for example, by alkyl or alkoxy groups having 1 or 2 carbon atoms. If R is an aryl radical, this is preferably a phenyl radical which can be unsubstituted or substituted by halogen atoms, nitro groups, alkyl or alkoxy groups having from 1 to 4 carbon atoms, preferably 1 or 2 carbon atoms.

If R is heteroyl radical, this radical can, in general, be derived from a five- or six-membered heterocycle, which preferably contains N, O and/or S as heteroatoms. The ring can be saturated or unsaturated, and can be unsubstituted or substituted, for example, by alkyl or alkoxy groups having 1 to 2 carbon atoms.

The heterocyclic ring W in formula II can contain N, O or S as heteroatoms, and preferably is aromatic. It may carry one or more substituents or may be fused to an aromatic ring. The fused aromatic ring preferably is a benzene ring. Suitable substituents for heterocyclic ring W are, among others, halogen atoms, alkyl groups having from 1 to 5 carbon atoms, alkoxy groups having from 1 to 3 carbon atoms and mononuclear or binuclear aryl groups. The aryl groups, in turn, can be substituted by halogen atoms, alkyl or alkoxy groups having from 1 to 3 carbon atoms, aralkyl groups having from 7 to 10 carbon atoms or aralkenyl groups having from 8 to 10 carbon atoms. The ring can also contain carbonyl groups as the ring members, for example, in the 2-pyrone ring.

Suitable N-heterocyclic compounds are mentioned in German Offenlegungsschrift No. 20 27 467 (corresponding to U.S. Pat. No. 3,751,259). They preferably are acridine derivatives. It is also possible to use phenazines which have a total of 1 or 2 benzene rings fused to the outer rings A and C and which carry up to two alkyl groups having from 1 to 5 carbon atoms or alkoxy groups having from 1 to 5 carbon atoms on one of the rings A and C. Quinoline derivatives, for example, the 2,3-dihydro-1H-cyclopenta[b]quinolines described in German Offenlegungsschrift No. 35 37 380 (corresponding to U.S. Pat. No. 4,737,445), are also suitable. Preferred are acridines that are substituted at the 9-position, preferably 9-arylacridines and particularly 9-phenylacridines.

The following compounds are illustrative of suitable N-heterocyclic compounds: 9-phenylacridines, 9-(4'-tolyl)-acridines, 9-(4'-methoxyphenyl)-acridines, 9-(4'-hydroxyphenyl)acridines, 9-acetylaminoacridines, benz[a]phenazines, 9-methyl-benz[a]phenazines, 9,10-dimethyl-benz[a]phenazines, 9-methyl-benz[a]phenazines, 10-methyl-benz[a]phenazines, 9-methoxy-benz[a]phenazines, 10-methoxy-benz[a]phenazines, dibenz[a,c]phenazines, 11-methoxy-dibenz[a,c]-phenazines, and dibenz[a,j]phenazines. Among these, 9-phenylacridine, 9-(4'-tolyl)acridine, benz[a]phenazine, 9-methyl-benz[a]phenazine, 2-styryl-quinoline, cinnamylidenequinaldine and 3-(o-chloro-benzylidene)-9-phenyl-2,3-dihydro-1H-cyclopenta[b]quinoline are particularly preferred.

Compounds with halogen atoms which are activated by —CO—, by —$SO_2$— or by a heterocyclic radical are disclosed in the above-mentioned publications. The following substances, for example, are particularly suitable for use in the present invention:

$C_6H_5$—$SO_2$—$CBr_3$
$C_6H_5$—$SO_2$—$CBr_2$—$C_6H_5$
$C_6H_5$—$SO_2$—$CBr_2$—CN
$C_6H_5$—$SO_2$—$CCl_2$—CN
$C_6H_5$—$SO_2$—$CBr_2$—CO—$NH_2$
$C_6H_5$—$SO_2$—$CCl_2$—CO—$N(C_2H_5)_2$
$CBr_3$—$SO_2$—$CBr_2$—CO—$C_6H_5$
$C_6H_5$—$SO_2$—$CBr_2$—CO—$C_6H_5$
$C_6H_5$—$SO_2$—$CBr_2$—CO—$OCH_3$
$NH_2$—CO—$CBr_2$—CO—$NH_2$
$CH_3$—NH—CO—$CBr_2$—CO—NH—$CH_3$

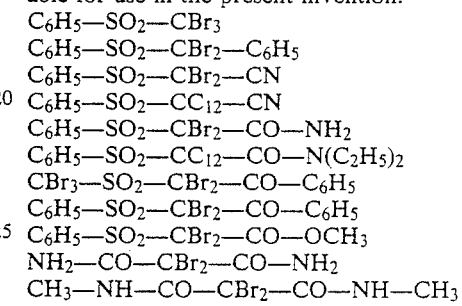

$NO_2$—$C_6H_4$—CO—$CBr_3$
$C_6H_5$—CO—$CBr_2$—CO—$CBr_3$
$CCl_3$—$C_6H_5$—CO—NH—$C_6H_4Cl$
$CCl_3$—$C_6H_5$—CO—NH—$C_6H_4$—O—$C_2H_5$ 2-alkyl- and 2-aryl-4,6-bis(trihalogenomethyl)-s-triazines and trihalogenomethylquinolines, such as 4-and 2-tribromomethylquinoline; oxazoles, oxadiazoles or 2-pyrones containing trichloromethyl or tribromomethyl groups.

Of these compounds, tribromomethylphenylsulfone, 2,2-dibromomalonic diamide, α,α-dibromo-α-cyanomethylphenylsulfone, α,α-dibromo-α-benzoylmethyl-phenylsulfone, α,α-dibromomalonic-bis-N-methylamide, 4,6-bis(trichloromethyl)-s-triazines and 2-tribromomethylquinoline are particularly useful. Among the 4,6-bis(trichloromethyl)-s-triazines, the derivatives substituted in the 2-position are preferably employed. The preferred substituents are methyl-, ethyl-, phenyl-, 4-methoxyphenyl- and 4'-styrylphenyl-.

The N-heterocyclic compound and the halogen compound represented by formula I or formula II are each normally used in a quantity ranging from about 0.01 to 3.0 percent by weight, preferably from 0.05 to 2.0 percent by weight, based on the non-volatile constituents of the composition. The quantitative ratio can be from 0.01 to 10 parts by weight, preferably from 0.05 to 3 parts by weight, of halogen compound I or II and 1 part by weight of N-heterocyclic compound.

Polymerizable compounds useful for purposes of the present invention are known, for example, from U.S. Pat. No. 2,760,863 and No. 3,060,023. Preferred examples are acrylic and methacrylic acid esters of dihydric or polyhydric alcohols, such as ethylene glycol diacrylate, polyethylene glycol dimethacrylate, acrylates and methacrylates of trimethylol ethane, of trimethylol propane, of pentaerythritol, of dipentaerythritol, and of polyhydric alicyclic alcohols. Reaction products of diisocyanates with partial esters of polyhydric alcohols are also used advantageously. Monomers of this kind are described in German Offenlegungsschriften No. 20 64 079, No. 23 61 041 and No. 28 22 190.

The proportion of monomers contained in the layer generally varies between about 10 and 80 weight-percent, preferably between 20 and 60 percent by weight.

A large number of soluble organic polymers can be employed as binders. Examples are: polyamides, polyvinyl esters, polyvinyl acetals, polyvinyl ethers, epoxide resins, polyacrylic acid esters, polymethacrylic acid esters, polyesters, alkyd resins, polyacrylamide, polyvinyl alcohol, polyethylene oxide, polydimethyl acrylamide, polyvinyl pyrrolidone, polyvinylmethyl formamide, polyvinylmethyl acetamide, and copolymers of the monomers which form the enumerated homopolymers. Other suitable binders are natural substances or modified natural substances, for example, gelatin and cellulose ethers.

With particular advantage, binders are used that are insoluble in water but that are soluble or at least swellable in aqueous-alkaline solutions, since layers containing such binders can be developed with the preferably employed aqueous-alkaline developers. Binders of this type can, for instance, contain the following groups —COOH, —PO$_3$H$_2$, —SO$_3$H, —SO$_2$NH—, —SO$_2$—NH—SO$_2$—, and —SO$_2$—NH—CO—. Examples of these binders are: maleate resins, polymers of β-methacryloyloxy-ethyl—N-(p-tolylsulfonyl)-carbamate and copolymers of these and similar monomers with other monomers, vinyl acetate/crotonic acid copolymers and styrene/maleic acid anhydride copolymers. Copolymers of alkylmethacrylates and methacrylic acid and copolymers of methacrylic acid, higher alkyl methacrylates and methyl methacrylate and/or styrene, acrylonitrile, and the like, which are described in German Offenlegungsschriften No. 20 64 080 and No. 23 63 806, are preferably used.

In general, the quantity of binder added ranges between 20 to 90 percent by weight, preferably 40 to 80 percent by weight, of the layer constituents. It is also preferred that the binder used in the present invention have an acid number of from 50 to 350.

Depending on their intended use and desired properties, the photopolymerizable compositions can contain various additional substances. Exemplary of these substances are adhesion promoters, inhibitors to prevent thermal polymerization of the monomers, hydrogen donors, substances that modify the sensitometric properties of layers of this type, dyes, color precursors such as leuco bases, colored and uncolored pigments, and plasticizers, for example, polyglycols and esters of p-hydroxyl-benzoic acid. Also included among suitable additional substances for use in the present invention are sulfur compounds, such as mercaptobenzimidazole, mercaptobenzthiazole, thiourea and thiourea derivatives, tetraalkylthiuramsulfide, disulfide and polysulfide; compounds containing a trivalent phosphorus, such as triphenylphosphine or triphenylphosphite; ascorbic acid and imidazole and imidazole derivatives.

These constituents advantageously should be selected to minimize absorption in the region of actinic radiation, which is important for the initiation process.

In this regard, suitable dyes unclude, for example, triarylmethane dyes, azo dyes and anthraquinone dyes, which are also used in combination with leuco bases of triarylmethane dyes. Triarylmethane dyes that can be employed in the present invention include, for example, crystal violet, Victoria Blue BH, Victoria Pure Blue BOH, methyl violet, fuchsin, malachite green, Acid Violet 5 B, Solar Cyanine 6 B, brilliant green, Acilan Violet S and, optionally, their leuco derivatives.

Suitable anthraquinone dyes include mordant dyes, acidic dyes, disperse dyes and vat dyes. Disperse Blue 134 (C.I. 61 551) is particularly preferred in this context.

An example of a suitable azo dye for the present invention is the product obtained by reacting 2,4-dinitro-6-chloro-benzene-diazonium salt with 2-methoxy-5-acetylamino-N-cyanoethyl-N-hydroxyethylaniline.

The content of leuco bases in the photopolymerizable composition, based on its non-volatile constituents, ranges from 0 to 2.5 percent, preferably from 0.8 to 2.0 percent. The corresponding content of dyes generally ranges from about 0.02 to 1.5 percent, preferably from about 0.04 to 1.0 percent. The quantitative ratio between dye and leuco base preferably ranges between 1.5:0 and 1:1.25.

The photopolymerizable composition of the present invention can be used in many applications, such as in the production of varnishes which are hardened by the action of actinic radiation and, in particular, in a light-sensitive copying material used for reproduction purposes. (In the present context, the phase "actinic radiation" denotes any radiation, the energy of which corresponds at least to that of shortwave visible light. Longwave UV-radiation is suitable, as is laser radiation.) Although the present description focuses to some extent on copying materials, the present invention is not limited thereto. Other examples of applications for the present invention in the reproduction field are: recording layers for the photomechanical production of printing plates suitable for relief printing, lithographic printing, gravure printing, or screen printing; relief copies, for example, in the production of Braille books; single copies; tanned images and pigment images. The compositions of the present invention can also be employed for the photomechanical production of etch resists, for example, for name plates, printed circuits, and chemical milling. The compositions of this invention are of particular importance with regard to the photomechanical production of lithographic printing plates and to photoresist technology.

A composition within the present invention can be used industrially for the above-mentioned applications as a liquid solution or dispersion, such as a photoresist solution, which is applied by the consumer to an appropriate support, for example, for chemical milling, for the production of printed circuits, screen printing stencils, and the like. A composition of the present invention can also be present as a solid light-sensitive layer coated on a suitable support, i.e., as a storable, photosensitive copying material, for example, for the production of printing plates. It can also be employed for the production of dry resists.

It is, in general, substantially advantageous to isolate the compositions of the present invention from the influence of atmospheric oxygen during light polymerization. If the composition is used in the form of a thin copying layer, it is recommended that a suitable cover film with a low permeability to oxygen be applied to the layer. The cover film may be self-supporting and removable from the copying layer prior to development. Polyester films, for example, are suitable for this purpose. The cover film may also comprise a material that dissolves in the developer liquid or that can be removed at least from the non-hardened areas during development. Examples of materials suitable for this purpose are waxes, polyvinyl alcohol, polyphosphates and sugars, among others.

Layer supports which are suitable for copying materials prepared using a composition within the present invention include, for example, aluminum, steel, zinc, copper, plastic films, such as films of polyethylene terephthalate or cellulose acetate, and screen printing supports, such as perlon gauze.

The light-sensitive materials incorporating the compositions of the present invention are conventionally prepared. Thus, the composition can be taken up in a solvent, and the resulting solution or dispersion can be applied to the intended support as a thin film by casting, spraying, immersion, or roller application and subsequently dried. Thick layers (for example, of 250 μm and thicker) are advantageously prepared by first producing a self-supporting film by extrusion or molding, which is then optionally laminated to the support. In the case of dry resists, solutions of the composition are applied to transparent intermediate supports and dried. The light-sensitive layers, having a thickness between about 10 and 100 μm, are then also bonded to the desired support by lamination, along with the temporary support.

The copying materials of the present invention can be processed using known methods. They are developed by treatment with an appropriate developer solution, for example, a solution of organic solvents, but preferably with a weakly alkaline aqueous solution, whereby the unexposed areas of the layer are dissolved away and the exposed areas of the copying layer remain on the support.

Unexpectedly, a considerable increase in light sensitivity is obtained when basic, N-heterocyclic photoinitiators, particularly of the acridine and phenazine type, are combined, in accordance with the present invention, with the above-evaluated prior art halogen compounds. Neither the individual components of the photoinitiator system nor combinations of the halogen compounds known per se with other than the N-heterocyclic compounds used according to the present invention attain such high light sensitivity.

The following examples illustrate preferred embodiments of the present invention. Quantitative ratios and percentages are to be understood as weight units, unless otherwise stated. As a rule, the amounts of the individual constituents are expressed in parts by weight (p.b.w.). A variant of an example marked (C) indicates that the latter is a comparative example.

The interaction with different halogen compounds is shown in a comparative way in Examples 1, 3, 4, 5 (C) and 7 for 9-phenylacridine, in Example 2 for 9-(4'tolyl)acridine, and in Example 5 (D,E) for benz[a]phenazine.

EXAMPLE 1

| | | |
|---|---|---|
| A(C) | 0.7 p.b.w. of | 2-(4'-methoxynaphth-1-yl)-4,6-bis-(trichloromethyl)-s-triazine, |
| B(C) | 0.7 p.b.w. of | 2-(p-trichloromethyl-benzoylmethylene)-3-ethylbenzothiazoline, |
| C(C) | 0.7 p.b.w. of | 2-phenyl-4,6-bis(trichloromethyl)-s-triazine, |
| D(C) | 0.7 p.b.w. of | 9-phenylacridine, |
| E(C) | 0.2 p.b.w. of | 2-phenyl-4,6-bis(trichloromethyl)-s-triazine and |
| | 0.5 p.b.w. of | 2-benzoylmethylene-3-methyl-naphtho-[1,2-d]thiazoline, |
| F(C) | 0.2 p.b.w. of | 2-phenyl-4,6-bis(trichloromethyl)-s-triazine and |
| | 0.5 p.b.w. of | N-phenylacridone, |
| G | 0.2 p.b.w. of | 2-phenyl-4,6-bis(trichloromethyl)-s-triazine and |
| | 0.5 p.b.w. of | 9-phenylacridine, |
| H | 0.2 p.b.w. of | tribromomethyl-phenylsulfone and |
| | 0.5 p.b.w. of | 9-phenylacridine or |
| I | 0.2 p.b.w. of | 2,2-dibromomalonic diamide and |
| | 0.5 p.b.w. of | 9-phenylacridine | were dissolved as photoinitiators in coating solutions comprised of

| | |
|---|---|
| 40 p.b.w. of | a copolymer of methylmethacrylate and methacrylic acid (acid number 115), |
| 40 p.b.w. of | trimethylolpropane triacrylate and |
| 0.5 p.b.w. of | Disperse Blue 134 (C.I. 61551) in |
| 520 p.b.w. of | 2-methoxyethanol. |

The solutions were spin-coated onto 0.3 mm thick aluminum which had been electrolytically gained and hardened by anodic oxidation. The coating layer was dried for 2 minutes at 100° C., such that a layer weight of 3.0 g/m² was obtained.

The sheets provided with the light-sensitive coatings were then coated with a 15 percent strength aqueous solution of polyvinyl alcohol (12 percent of residual acetyl groups, K-value 4) and again dried to give a layer weight of from 4 to 5 g/m².

The printing plates thus obtained were exposed for 15 seconds to the light of 5 kW metal halide lamp arranged at a distance of 110 cm, under a negative original, together with a 13-step exposure wedge having density increments of 0.15.

The portions of the light-sensitive layer that had not been hardened by light were removed by wiping over with a developer solution of the following composition:

| | |
|---|---|
| 3 p.b.w. of | sodium metasilicate.9 H₂O, |
| 0.05 p.b.w. of | strontium chloride, |
| 0.03 p.b.w. of | a non-ionic wetting agent (coconut oil alcohol-polyoxyethylene ether having about 8 oxyethylene units), |
| 0.003 p.b.w. of | an anti-foaming agent, |
| 100 p.b.w. of | demineralized water. |

The number of completely hardened steps of the exposure wedge is a measure of light-sensitivity. The values obtained for samples A to I are compiled in the following table.

| Sample | Number of Steps |
|---|---|
| A (C) | 4 |
| B (C) | 5 |
| C (C) | 0 |
| D (C) | 4 |
| E (C) | 3 |
| F (C) | 0 |
| G | 7 |
| H | 7 |
| I | 7 |

When 2-phenyl-4,6-bis(trichloromethyl)s-triazine was replaced in Sample F by the same quantities by weight of 2,4,6-tris-$\alpha,\alpha$-dichloroethyl-s-triazine or 4,6-trichloromethyl-s-triazine-2-carboxylic acid ethylester, comparable results were obtained.

EXAMPLE 2

| | | |
|---|---|---|
| A(C) | 0.7 p.b.w. of | 2-(4'-methoxystyryl)-4,6-bis(trichloromethyl)-s-triazine, |
| B(C) | 0.7 p.b.w. of | 2-(4'-ethoxynaphth-1-yl)-4,6-bis(trichloromethyl)-s-triazine, |
| C(C) | 0.5 p.b.w. of | 2-benzoylmethylene-3-methyl-naphtho-[1,2-d]thiazoline and |
| | 0.2 p.b.w. of | 2-methyl-4,6-bis(trichloromethyl)-s-triazine, |
| D(C) | 0.7 p.b.w. of | 9-p-tolylacridine, |
| E | 0.5 p.b.w. of | 9-p-tolylacridine and |
| | 0.2 p.b.w. of | 2-(4'-methoxystyryl)-4,6-bis(trichloromethyl)-s-triazine, |
| F | 0.5 p.b.w. of | 9-p-tolylacridine and |
| | 0.2 p.b.w. of | tribromomethyl-phenylsulfone, |
| G | 0.5 p.b.w. of | 9-p-tolylacridine and |
| | 0.2 p.b.w. of | 2-methyl-4,6-bis(trichloromethyl)-s-triazine, |
| H | 0.5 p.b.w. of | 9-p-tolylacridine and |
| | 0.2 p.b.w. of | 2-tribromomethylquinoline, |
| I | 0.5 p.b.w. of | 9-p-tolylacridine and |
| | 0.2 p.b.w. of | dibromo-cyanomethyl-phenylsulfone, |
| K | 0.5 p.b.w. of | 9-p-tolylacridine and |
| | 0.2 p.b.w. of | $\alpha,\alpha$-dibromo-$\alpha$-benzoylmethyl-phenylsulfone, |
| L(C) | 0.7 p.b.w. of | tribromomethyl-phenylsulfone, |
| M(C) | 0.7 p.b.w. of | 2-methyl-4,6-bis(trichloromethyl)-s-triazine or |
| N(C) | 0.7 p.b.w. of | 2-tribromomethylquinoline | were dissolved as photoinitiators in coating solutions comprised of

| | |
|---|---|
| 39 p.b.w. of | a copolymer of methylmethacrylate and methacrylic acid (acid number 115), |
| 39 p.b.w. of | trimethylolethanetriacrylate, |
| 0.1 p.b.w. of | crystal violet and |
| 1.5 p.b.w. of | leuco crystal violet in |
| 450 p.b.w. of | 1-methoxypropan-2-ol and |
| 75 p.b.w. of | butanone. |

The solutions were applied to pretreated aluminum, as in Example 1, and after drying (layer weight 2.8 g/m²) the layers were coated with covering layers of polyvinyl alcohol.

The plates were exposed under a gray step wedge using a 5 kW metal halide lamp arranged at a distance of 110 cm for such a period that the area below step 5, having an optical density of 0.80, was polymerized just to such an extent that it was not attacked when developing the plates with the developer of Example 1. The area corresponding to step 6 was partly removed by development under these conditions.

In this manner, an exposure time could be determined for each sample, which yielded the optimum resolution and a good print run.

The following table indicates the exposure times determined for the individual printing plates:

| Sample | Exposure Time |
|---|---|
| A (C) | 20 seconds |
| B (C) | 20 seconds |
| C (C) | 25 seconds |
| D (C) | 40 seconds |
| E | 10 seconds |

-continued

| Sample | Exposure Time |
|---|---|
| F | 8 seconds |
| G | 8 seconds |
| H | 8 seconds |
| I | 8 seconds |
| K | 8 seconds |
| L(C) | >100* seconds |
| M(C) | >100* seconds |
| N(C) | >100* seconds |

*No light hardening resulted in the case of these plates. The light-sensitive layer was completely removed during development.

EXAMPLE 3

| | | |
|---|---|---|
| A(C) | 0.2 p.b.w. of | 2-methyl-4,6-bis(trichloromethyl)-s-triazine, |
| B(C) | 0.2 p.b.w. of | 2,2-dibromomalonic diamide, |
| C | 0.1 p.b.w. of | 9-phenylacridine and |
| | 0.1 p.b.w. of | 2-methyl-4,6-bis(trichloromethyl)-s-triazine, |
| D | 0.1 p.b.w. of | 9-phenylacridine and |
| | 0.1 p.b.w. of | 2,2-dibromomalonic diamide or |
| E(C) | 0.2 p.b.w. of | 9-phenylacridine | were added as photoinitiators to coating solutions comprised of

| | |
|---|---|
| 19 p.b.w. of | a copolymer of methylmethacrylate and methacrylic acid (98:2), having a molecular weight of about 34.000, |
| 12 p.b.w. of | trimethylolpropanetriacrylate, |
| 0.2 p.b.w. of | leuco crystal violet and |
| 0.1 p.b.w. of | malachite green in |
| 69 p.b.w. of | butanone. |

The solutions were coated on a 25 μm thick biaxially drawn polyethylene terephthalate film, such that a layer weight of 45 g/m² was obtained after drying at 100° C.

The dry resist film thus obtained was laminated to a phenoplast laminate clad with a 35 μm thick copper foil, using a commercial laminator at 120° C. and exposed for 20 seconds under an original of a printed circuit board. After exposure, a high-contrast image resulted on plates C and D, whereas no image was formed on plates A, B and E.

Following spray development with trichloroethane, the transparent portions of the original were reproduced as resist areas at exact distances on plates C and D. No light-hardened resist portions whatsoever remained on plates A and B; plate E only showed a useless, severely attacked image of the original.

EXAMPLE 4

| | | |
|---|---|---|
| A(C) | 0.3 p.b.w. of | 9-phenylacridine, |
| B(C) | 0.3 p.b.w. of | $\alpha,\alpha$-dibromo-$\alpha$-cyanomethyl-phenylsulfone, |
| C | 0.2 p.b.w. of | 9-phenylacridine and |
| | 0.1 p.b.w. of | $\alpha,\alpha$-dibromo-$\alpha$-cyanomethyl-phenylsulfone, |
| D(C) | 0.3 p.b.w. of | 2,2-dibromomalonic-bis-N-methylamide or |
| E | 0.2 p.b.w. of | 9-phenylacridine and |
| | 0.1 p.b.w. of | 2,2-dibromomalonic-bis-N-methylamide | were added as photoinitiators to coating solutions comprised of

| | | |
|---|---|---|
| 20 p.b.w. of | a terpolymer of styrene, n-hexylmethacrylate and methacrylic acid (10:60:30) having an acid number of 190, | |
| 20 p.b.w. of | the reaction product obtained from 1 mole of 2,2,4-trimethyl-hexamethylene-diisocyanate and 2 moles of 2-hydroxyethyl-methacrylate, | |
| 0.02 p.b.w. of | 1,4-bis-(4-tert.-butoxy-phenylamino)-5,8-dihydroxyanthraquinone (Polysynthren Green ®), | |
| 0.35 p.b.w. of | leuco crystal violet in | |
| 46 p.b.w. of | butanone and | |
| 23 p.b.w. of | ethanol. | |

Each of these solutions was applied to a 25 μm thick polyethylene terephthalate film and dried for 2 minutes at 100° C. in a drying oven. The dry resist layers obtained had a layer weight of 50 g/m².

The dry resist layers were protected from dust and damage by 20 μm-thick covering films of polyethylene. In this way it is possible to store dry resist films for a prolonged period in the absence of light.

After the covering film was peeled off, a commercial laminator was used to laminate each dry resist layer, at 120° C. and at a speed of 1.5 m/min, to a precleaned copper foil laminated to an epoxide-glass fiber laminated fabric.

Samples A to E of the resists laminated to the copper surfaces were then exposed through the support films, under an original showing a line pattern of light and dark bars, each of which had a width of 140 μm, and a 13-step exposure wedge with density increments of 0.15. The sheets were exposed for 4 seconds to the light of an iron-doped 5 kW metal halide lamp arranged at a distance of 80 cm.

After peeling off the support films, the exposed sheets were spray-developed with an 0.8 percent strength sodium hydroxide solution at 25° C. The developing time was about 60 seconds in each case.

Comparative Samples B and D did not exhibit any light sensitivity; the resist layers had become completely detached in the course of the developing process.

Samples C and E according to the present invention were completely hardened up to step 6; Comparative Sample A, on the other hand, was hardened up to step 5 only. In Comparative Sample A, the bars of the line pattern were reproduced true-to-scale, where as they had widened by 8 to 10% in Samples C and E, due to overexposure. To obtain a true-to-scale 1:1 reproduction in Samples C and E, the exposure time had to be reduced from 4 to 3 seconds. Samples C and E consequently had a light sensitivity which was about 35% higher than the light sensitivity of Comparative Sample A.

Similarly good results were obtained when the α,α-dibromo-α-cyanomethyl-phenylsulfone in C was replaced, for example, by α,α-dibromo-α-cyanoacetic acid morpholide or 2-methyl-4,6-bis(trichloromethyl)-s-triazine.

EXAMPLE 5

| | | |
|---|---|---|
| A(C) | 0.5 p.b.w. of | 9-phenylacridine |
| B(C) | 0.5 p.b.w. of | benz[a]phenazine, |
| C | 0.5 p.b.w. of | 9-phenylacridine and |
| | 0.5 p.b.w. of | 2-methyl-4,6-bis(trichloromethyl)-s-triazine, |
| D | 0.5 p.b.w. of | benz[a]phenazine and |
| | 0.5 p.b.w. of | 2-methyl-4,6-bis(trichloromethyl)-s-triazine, |
| E | 0.5 p.b.w. of | 9-methyl-benz[a]phenazine and |
| | 0.5 p.b.w. of | 2-methyl-4,6-bis(trichloromethyl)-s-triazine |
| F(C) | 0.5 p.b.w. of | 2-methyl-4,6-bis(trichloromethyl)-s-triazine, | were dissolved as photoinitiators in coating solutions comprised of

| | |
|---|---|
| 40 p.b.w. of | a terpolymer of n-hexylmethacrylate, methacrylic acid and styrene (60:30:10) having a mean molecular weight of about 35.000 and an acid number of 195, |
| 40 p.b.w. of | the reaction product obtained from 1 mole of 2,2,4-trimethyl-hexamethylene-diisocyanate and 2 moles of 2-hydroxyethyl-methacrylate and |
| 0.4 p.b.w. of | an azo dye obtained from 2,4-Dinitro-6-chlorobenzenediazonium salt and 2-methoxy-5-acetylamino-N-cyanoethyl-N-hydroxyethylaniline in |
| 550 p.b.w. of | 1-methoxy-propan-2-ol and |
| 120 p.b.w. of | butanone. |

The solutions were applied to pretreated aluminum, as in Example 1, and after drying (layer weight 2.8 g/m²) the layers were coated with a covering layer of polyvinyl alcohol.

As in Example 2, the plates were exposed in such a manner that, by developing for 1 minute with the developer used in Example 1, step 5 was not attacked but step 6 was partially removed.

The following exposure times were determined for the individual samples:

| Sample | Exposure Time |
|---|---|
| A (C) | 10.0 seconds |
| B (C) | 12.0 seconds |
| C | 7.0 seconds |
| D | 5.0 seconds |
| E | 5.0 seconds |
| F (C) | >100* seconds |

*No light hardening occurred in the case of this sample.

EXAMPLE 6

| | | |
|---|---|---|
| A(C) | 1.0 p.b.w. of | 9-(4'-methoxyphenyl)-acridine, |
| B | 0.5 p.b.w. of | 9-(4'-methoxyphenyl)-acridine and |
| | 0.5 p.b.w. of | 2-methyl-4,6-bis(trichloromethyl)-s-triazine, |
| C(C) | 0.5 p.b.w. of | 2-benzoylmethylene-3-methyl-naphtho[1,2-d]thiazoline and |
| | 0.5 p.b.w. of | 2-methyl-4,6-bis(trichloromethyl)-s-triazine, |
| D(C) | 1.0 p.b.w. of | 2-methyl-4,6-bis(trichloromethyl)-s-triazine | were dissolved as photoinitiators in coating solutions comprised of

| | |
|---|---|
| 14 p.b.w. of | a styrene/maleic anhydride copolymer having an acid number of 190 and a mean molecular weight of 10.000, |
| 13 p.b.w. of | trimethylolpropanetriacrylate, |
| 2 p.b.w. of | polyethylene glycol esterified at |

-continued

| | | |
|---|---|---|
| | | both ends with methacrylic acid (molecular weight 400) and |
| 0.25 p.b.w. of | | Disperse Blue 134 (C.I. 61551) in |
| 170 p.b.w. of | | 2-methoxyethanol. |

The solutions were applied to pretreated aluminum, as in Example 1, and provided with a covering layer of polyvinyl alcohol. Exposure was then performed for 15 seconds at a distance of 110 cm under a step wedge. The printing plates were developed by wiping over with the following solution:

| | |
|---|---|
| 1.5 p.b.w. of | sodium metasilicate-nonahydrate, |
| 0.3 p.b.w. of | polyglycol (molecular weight 6000), |
| 0.05 p.b.w. of | levulinic acid, |
| 0.03 p.b.w. of | strontium hydroxide-octahydrate in |
| 100 p.b.w. of | water. |

| Sample | Number of Steps |
|---|---|
| A (C) | 2 |
| B | 7 |
| C (C) | 4 |
| D (C) | 0 |

In addition, the exposure times were determined at which the area below step 5 was just hardened while the area at step 6 was severely attacked. The following values were obtained:

| Sample | Exposure Time |
|---|---|
| A (C) | 40 seconds |
| B | 7 seconds |
| C (C) | 21 seconds |
| D (C) | >100* seconds |

*No light hardening occurred in the case of this sample.

EXAMPLE 7

| | | |
|---|---|---|
| A | 0.5 p.b.w. of | 9-phenylacridine and |
| | 0.04 p.b.w. of | tribromomethyl-phenylsulfone, |
| B | 0.5 p.b.w. of | 9-phenylacridine and |
| | 0.4 p.b.w. of | tribromomethyl-phenylsulfone, |
| C | 0.5 p.b.w. of | 9-phenylacridine and |
| | 2.0 p.b.w. of | tribromomethyl-phenylsulfone, |
| D | 0.5 p.b.w. of | 9-phenylacridine and |
| | 0.04 p.b.w. of | 2-methyl-4,6-bis(trichloromethyl)-s-triazine, |
| E | 0.5 p.b.w. of | 9-phenylacridine and |
| | 0.4 p.b.w. of | 2-methyl-4,6-bis(trichloromethyl)-s-triazine, |
| F | 0.5 p.b.w. of | 9-phenylacridine and |
| | 2.0 p.b.w. of | 2-methyl-4,6-bis(trichloromethyl)-s-triazine, | were added as photoinitiators to coating solutions composed of

| | |
|---|---|
| 39 p.b.w. of | a copolymer of methylmethacrylate and methacrylic acid (acid number 115), |
| 39 p.b.w. of | trimethylolethanetriacrylate, |
| 0.1 p.b.w. of | crystal violet and |
| 1.5 p.b.w. of | leuco crystal violet in |
| 450 p.b.w. of | 1-methoxypropan-2-ol and |
| 75 p.b.w. of | butanone. |

The procedure of Example 2 was followed: the solutions were applied to pretreated aluminum and, after drying, the layers were coated with covering layers of polyvinyl alcohol. By exposing under a gray step wedge, the exposure times resulting in the optimum resolution were determined. The following values were obtained:

| Sample | Exposure Time |
|---|---|
| A | 10 seconds |
| B | 8 seconds |
| C | 8 seconds |
| D | 10 seconds |
| E | 8 seconds |
| F | 8 seconds |

EXAMPLE 8

| | | |
|---|---|---|
| A(C) | 0.35 p.b.w. of | 9-(p-acetoxyphenyl)acridine, |
| B | 0.25 p.b.w. of | 9-(p-acetoxyphenyl)acridine and |
| | 0.1 p.b.w. of | tribromomethyl-phenylsulfone, or |
| C | 0.25 p.b.w. of | 3-(p-acetoxybenzylidene)-9-phenyl-2,3 dihydro-1H-cyclopenta[b]quinoline and |
| | 0.1 p.b.w. of | tribromomethyl-phenylsulfone | were added as photoinitiators to coating solutions comprised of

| | |
|---|---|
| 60 p.b.w. of | a terpolymer of methylmethacrylate, n-hexylmethacrylate and methacrylic acid (10:55:35) having an acid number of 220, |
| 60 p.b.w. of | the reaction product obtained from 1 mole of 2,2,4-trimethyl-hexamethylene-diisocyanate and 2 moles of 2-hydroxyethyl-methacrylate, |
| 0.06 p.b.w. of | 1,4-bis-(4-tert.-butoxy-phenyl-amino)- 5,8-dihydroxyanthraquinone (Polysynthren Green ®), |
| 1.05 p.b.w. of | leuco malachite green in |
| 0.3 p.b.w. of | mercaptobenzimidazole, |
| 0.3 p.b.w. of | ascorbic acid, |
| 138 p.b.w. of | butanone and |
| 69 p.b.w. of | ethanol. |

Each of the solutions so prepared was applied to a 25 μm-thick polyethylene terephthalate film. Coating was followed by drying for 2 minutes at 100° C. in a drying oven. The resulting dry resist layers had a layer weight of 45 g/m².

The dry resist layers were protected from dust and damage with 20 μm-thick covering films of polyethylene, as in Example 4. After the covering film was peeled off, a commercial laminator was used to laminate the dry resist layer, at 120° C. and at a speed of 1.5 m/min, to a pre-cleaned copper foil laminated to an epoxide-glass fiber laminated fabric.

Samples A to C of the resists laminated to the copper surface were then exposed through the support films, under an original showing a line pattern of light and dark bars each of which had a width of 100 μm. The resists were exposed for 3, 4, 5 and 6 seconds to the light of an iron-doped 5 kW metal halide lamp arranged at a distance of 95 cm.

After the support films were peeled off, the exposed sheets were spray-developed with a 1 percent strength sodium carbonate solution at 25° C. The developing time was about 60 seconds in each case.

Following development, the exposure time yielding an optimum line reproduction was determined. In the case of Sample A, 6 seconds were required; a shorter exposure resulted in insufficient light hardening and, as a consequence, in narrowed, washed-out lines. Optimum exposure for Sample B was 3 seconds, for Sample C 4 seconds; a longer exposure time produced widening of lines, i.e., if exposed for 6 seconds, Samples B and C were overexposed.

What is claimed is:

1. A photopolymerizable composition comprising:
   (a) a polymeric binder,
   (b) an acrylic or methacrylic acid ester of a dihydric or polyhydric alcohol,
   (c) an N-heterocyclic photoinitiator compound and additionally
   (d) a halogen compound represented by one of the following formulas:

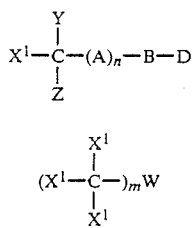

in which
   $X^1$ is chlorine or bromine,
   Y and Z are identical or different and each is $X^1$, hydrogen, CN or $(A)_n$—$(B)_n$—D,
   A is a phenylene group,
   n is 0 or 1,
   B is CO or $SO_2$,
   D is R, OR, NHR, $NH_2$, $NR_2$ or $CX^1X^2X^3$,
   R is an alkyl, a cycloalkyl, an aryl or a heteroyl radical,
   $X^2$ and $X^3$ are identical or different, and each is $X^1$, hydrogen or an alkyl group,
   W is a five or six-membered heterocyclic ring having from 1 to 3 heteroatoms, and
   m is 1 or 2,
wherein the N-heterocyclic photoinitiator is selected from the group consisting of a phenazine that has a total of 1 or 2 benzene rings fused to the outer rings thereof and that carries up to two alkyl or alkoxy groups having from 1 to 5 carbon atoms on one of the outer rings thereof, an acridine and a 2,3-dihydro-1H-cyclopenta[b]-quinoline.

2. A photopolymerizable composition as claimed in claim 1, wherein W is a five- or six-membered heterocyclic ring fused to an aromatic ring.

3. A photopolymerizable composition as claimed in claim 1, wherein W is a five- or six-membered heterocyclic ring carrying at least one substituent.

4. A photopolymerizable composition as claimed in claim 1, wherein the N-heterocyclic photoinitiator compound is an acridine which is aryl-substituted at the 9-position.

5. A photopolymerizable composition as claimed in claim 1, wherein the halogen compound is represented by formula I and is selected from the group consisting of tribromomethyl-phenylsulfone, 2,2-dibromomalonic diamide, a,a-dibromo-a-cyanomethylphenylsulfone, a,a-dibromo-a-benzoylmethyl-phenylsulfone and a,a-dibromomalonic-bis-N-methylamide.

6. A photopolymerizable composition as claimed in claim 1, wherein the halogen compound is represented by formula II and is a 4,6-bis(trichloromethyl)-s-triazine substituted at the 2-position or a 2-tribromomethyl-quinoline.

7. A photomerizable composition as claimed in claim 6, wherein the halogen compound is a 4,6-bis(trichloromethyl)-s-triazine substituted at the 2-position, the 2-position substituent comprising an alkyl or aryl radical.

8. A photopolymerizable composition as claimed in claim 1, wherein constituent (d) is present in an amount ranging from about 0.01 to 3.0 percent by weight.

9. A photopolymerizable composition as claimed in claim 1, further comprising a dye or a combination of a dye with a leuco dye.

10. A photopolymerizable composition as claimed in claim 1, wherein the polymeric binder is insoluble in water and is soluble or swellable in an aqueous-alkaline solution.

11. A photopolymerizable composition as claimed in claim 10, wherein the polymeric binder has an acid number of from 50 to 350.

12. A photopolymerizable recording material comprising a support and a photopolymerizable layer that comprises:
   (a) a polymeric binder,
   (b) an acrylic or methacrylic acid ester of a dihydric or polyhydric alcohol,
   (c) an N-heterocyclic photoinitiator compound and additionally
   (d) a halogen compound represented by one of the following formulas:

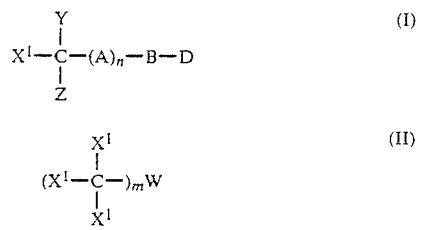

in which
   $X^1$ is chlorine or bromine,
   Y and Z are identical or different and each is $X^1$, hydrogen, CN or $(A)_n$—$(B)_n$—D,
   A is a phenylene group,
   n is 0 or 1,
   B is CO or $SO_2$,
   D is R, OR, NHR, $NH_2$, $NR_2$ or $CX^1X^2X^3$,
   R is an alkyl, a cycloalkyl, an aryl or a heteroyl radical,
   $X^2$ and $X^3$ are identical or different, and each is $X^1$, hydrogen or an alkyl group,
   W is a five or six-membered heterocyclic ring having from 1 to 3 heteroatoms, and
   m is 1 or 2,
wherein the N-heterocyclic photoinitiator is selected from the group consisting of a phenazine that has a total of 1 or 2 benzene rings fused to the outer rings thereof and that carries up to two alkyl or alkoxy groups having from 1 to 5 carbon atoms on one of the outer rings thereof, an acridine and a 2,3-dihydro-1H-cyclopenta[b]-quinoline.

13. A photopolymerizable recording material as claimed in claim 12, wherein W is a five- or six-membered heterocyclic ring fused to an aromatic ring.

14. A photopolymerizable recording material as claimed in claim 12, wherein W is a five- or six-membered heterocyclic ring carrying at least one substituent.

15. A photopolymerizable recording material as claimed in claim 12, wherein the support has a surface selected from the group consisting of aluminum, copper, an aluminum alloy and a copper alloy.

16. A photopolymerizable recording material as claimed in claim 15, wherein the support comprises a transparent plastic film.

17. A photopolymerizable composition as claimed in claim 1, wherein the N-heterocyclic photoinitiator is an acridine.

18. A photopolymerizable composition as claimed in claim 1, wherein the N-heterocyclic photoinitiator is a phenazine.

19. A photopolymerizable composition as claimed in claim 1, wherein the N-heterocyclic photoinitiator is a quinoline.

* * * * *